US012770707B2

(12) United States Patent
Schneider et al.

(10) Patent No.: US 12,770,707 B2
(45) Date of Patent: Oct. 20, 2026

(54) BIT INVERSION TECHNIQUES FOR MEMORY SYSTEM REPAIR INDICATIONS

(71) Applicant: Micron Technology, Inc., Boise, ID (US)

(72) Inventors: Ronny Schneider, Höhenkirchen-Siegertsbrunn (DE); Marcos Alvarez Gonzalez, Munich (DE); Casto Salobrena Garcia, Munich (DE); Michael Dieter Richter, Ottobrunn (DE); Thomas Hein, Munich (DE); Mohammad Aasim Ekhtiyar, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/765,074

(22) Filed: Jul. 5, 2024

(65) Prior Publication Data

US 2025/0029673 A1 Jan. 23, 2025

Related U.S. Application Data

(60) Provisional application No. 63/513,992, filed on Jul. 17, 2023.

(51) Int. Cl.
*G11C 29/44* (2006.01)

(52) U.S. Cl.
CPC ................................ *G11C 29/4401* (2013.01)

(58) Field of Classification Search
CPC ............................ G11C 29/4401; G11C 29/76
See application file for complete search history.

(56) References Cited

U.S. PATENT DOCUMENTS

| | | | | |
|---|---|---|---|---|
| 2006/0259678 A1* | 11/2006 | Gervasi | .................... | G11C 5/00 711/2 |
| 2013/0111102 A1* | 5/2013 | Kim | ..................... | G11C 7/1006 711/E12.001 |
| 2020/0243153 A1* | 7/2020 | Kumar | ................... | G11C 29/38 |
| 2024/0046972 A1* | 2/2024 | Ji | .......................... | G11C 11/408 |

* cited by examiner

*Primary Examiner* — Thien Nguyen
(74) *Attorney, Agent, or Firm* — Holland & Hart

(57) ABSTRACT

Methods, systems, and devices for bit inversion techniques for memory system repair indications are described. A memory system may store an address of a failed access line or an inversion of the address based on a quantity of bits having a first bit value. For example, if an address has a quantity of '1's that is greater than a threshold, the memory system may store an inversion of the address by inverting the address and setting one-time programmable (OTP) elements to indicate the inverted '1's. The memory system may also store an additional inversion bit to indicate the inversion of the address. For reading the OTP elements, the memory system may interpret an address as inverted or non-inverted based on the inversion bit. The memory system may also indicate one or more steps of a repair process to a host system to facilitate communication during repair procedures.

20 Claims, 8 Drawing Sheets

BIT INVERSION TECHNIQUES FOR MEMORY SYSTEM REPAIR INDICATIONS

CROSS REFERENCE

The present application for patent claims the benefit of U.S. Provisional Patent Application No. 63/513,992 by SCHNEIDER et al., entitled "BIT INVERSION TECHNIQUES FOR MEMORY SYSTEM REPAIR INDICATIONS," filed Jul. 17, 2023, assigned to the assignee hereof, and expressly incorporated by reference in its entirety herein.

TECHNICAL FIELD

The following relates to one or more systems for memory, including bit inversion techniques for memory system repair indications.

BACKGROUND

Memory devices are used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored by the memory cell. To store information, a memory device may write (e.g., program, set, assign) states to the memory cells. To access stored information, a memory device may read (e.g., sense, detect, retrieve, determine) states from the memory cells.

DETAILED DESCRIPTION

Figure 1:
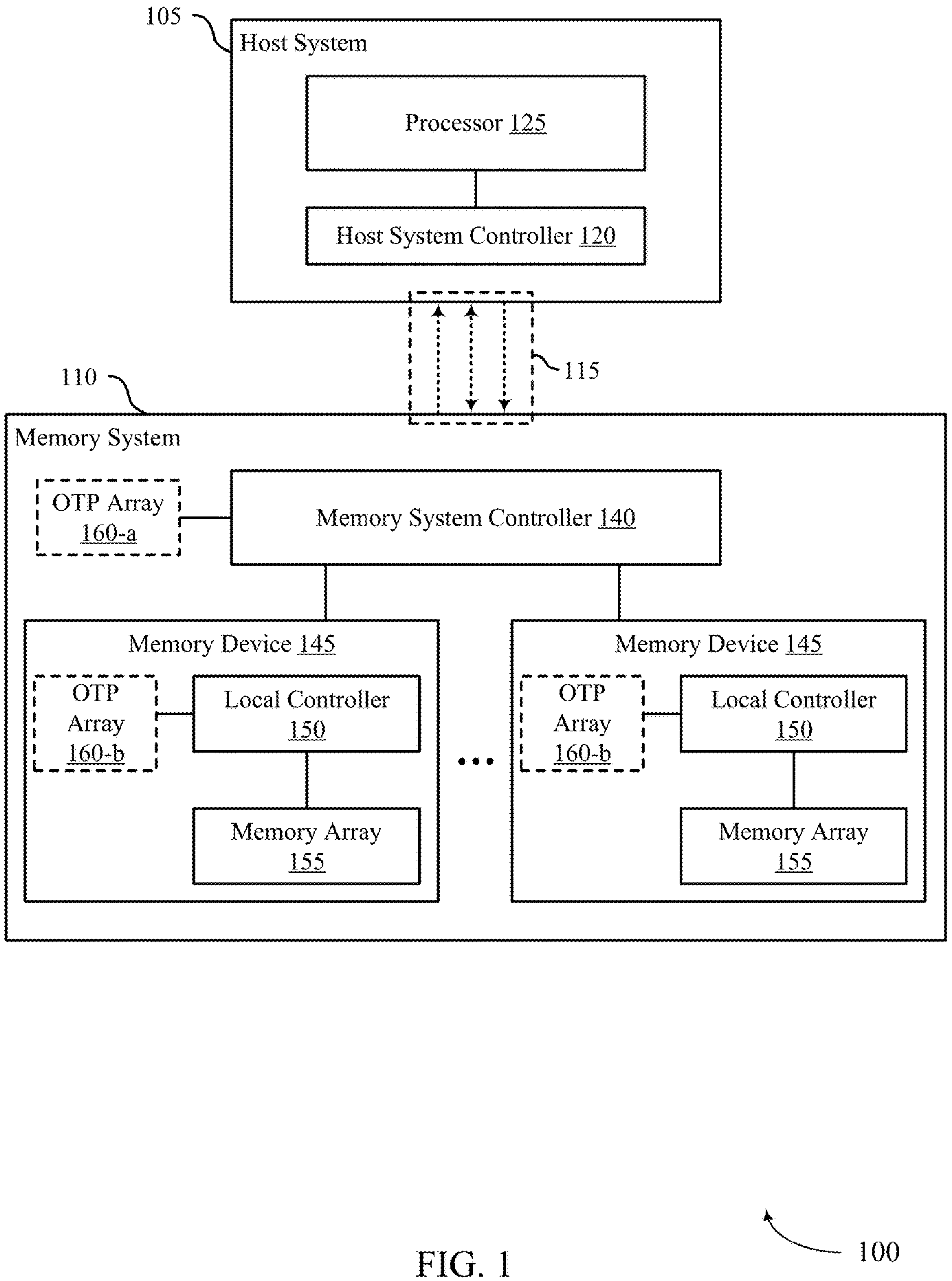
FIG. 1 shows an example of a system that supports bit inversion techniques for memory system repair indications in accordance with examples as disclosed herein.

Some memory systems may support repair operations, such as a post-package repair (PPR) after manufacturing or assembly, to correct failures associated with access lines of a memory array of the memory system (e.g., row repairs, column repairs). For example, a memory system may include redundant access lines to be used in place of failed access lines, where access line failures may be detected by the memory system or by a host system coupled with the memory system. In some cases, an address (e.g., a physical address) of a failed access line may be stored by setting (e.g., programming, writing) one or more one-time programmable (OTP) elements (e.g., fuses, antifuses) to indicate the address. However, indicating some addresses may involve setting a relatively large quantity of OTP elements, which may involve a relatively long duration for repairs and relatively high latency for operations of the memory system, of the host system (e.g., as the host system may suspend operations during a repair), or both.

In accordance with examples as disclosed herein, a memory system may implement bit inversion for access line repair indications. For example, a memory system may store an address of a failed access line or an inversion of the address based on a quantity of bits with a logic value (e.g., a logic state, a bit value). In some examples, if an address has fewer bits with a logic 1 value than bits with a logic 0 value, the memory system may store the address by setting some OTP elements to indicate the logic 1 values of the address and maintaining other OTP elements in an original state to indicate the logic 0 values of the address. In some other examples, if the address has more bits with a logic 1 value than bits with a logic 0 value, the memory system may store an inversion of the address, such that logic 1 values are inverted to logic 0 values, and vice versa, by setting OTP elements to indicate the inverted logic 0 values. The memory system may also store an inversion bit (e.g., a fuse bit inversion (FBI) bit) to indicate whether an address is inverted. To read the OTP elements, the memory system may interpret an address as inverted or non-inverted based on a value of the inversion bit. In some examples, the memory system may indicate one or more steps of the repair to a host system to coordinate operations during a repair process.

The present techniques may support one or more advantages for operations of a memory system, for a host system, or both. For example, storing an inversion of an address may reduce a quantity of OTP elements that are set to indicate an address of a failed access line, thereby reducing a duration for setting OTP elements and consequently reducing a duration of repair procedures. Additionally, or alternatively, a longer duration may be allocated to setting each OTP element due to a reduced quantity of OTP elements to be set, which may increase a reliability of logic states stored by the OTP elements. In some examples, indicating one or more steps of a repair process (e.g., via a feedback signal) between the memory system and a host system may reduce latency by allowing the host system to proceed with new operations following a shortened duration of the repair process, and may increase reliability by enabling the host system to confirm entry or completion of one or more repair operations and to allocate a longer duration for setting each OTP element.

Features of the disclosure are illustrated and described in the context of systems and architectures. Features of the disclosure are further illustrated and described in the context of processes, ordering operations, signaling diagrams, and flowcharts.

FIG. 1 illustrates an example of a system 100 that supports bit inversion techniques for memory system repair indications in accordance with examples as disclosed herein. The system 100 may include portions of an electronic device, such as a computing device, a mobile computing device, a wireless communications device, a graphics processing device, a vehicle, a smartphone, a wearable device, an internet-connected device, a vehicle controller, a system on a chip (SoC), or other stationary or portable electronic system, among other examples. The system 100 includes a host system 105, a memory system 110, and one or more channels 115 coupling the host system 105 with the memory system 110 (e.g., to support a communicative coupling). The system 100 may include any quantity of one or more memory systems 110 coupled with the host system 105.

The host system 105 may include one or more components (e.g., circuitry, processing circuitry, one or more processing components) that use memory to execute processes, any one or more of which may be referred to as or be included in a processor 125. The processor 125 may include at least one of one or more processing elements that may be co-located or distributed, including a general-purpose processor, a digital signal processor (DSP), an application-specific integrated circuit (ASIC), a field-programmable gate array (FPGA) or other programmable logic device, a controller, discrete gate or transistor logic, one or more discrete hardware components, or a combination thereof. The processor 125 may be an example of a central processing unit (CPU), a graphics processing unit (GPU), a general-purpose GPU (GPGPU), or an SoC or a component thereof, among other examples.

The host system 105 may also include at least one of one or more components (e.g., circuitry, logic, instructions) that implement the functions of an external memory controller (e.g., a host system memory controller), which may be referred to as or be included in a host system controller 120. For example, a host system controller 120 may issue commands or other signaling for operating the memory system 110, such as write commands, read commands, configuration signaling or other operational signaling. In some examples, the host system controller 120, or associated functions described herein, may be implemented by or be part of the processor 125. For example, a host system controller 120 may be hardware, instructions (e.g., software, firmware), or some combination thereof implemented by the processor 125 or other component of the host system 105. In various examples, a host system 105 or a host system controller 120 may be referred to as a host.

The memory system 110 provides physical memory locations (e.g., addresses) that may be used or referenced by the system 100. The memory system 110 may include a memory system controller 140 and one or more memory devices 145 (e.g., memory packages, memory dies, memory chips) operable to store data. The memory system 110 may be configurable for operations with different types of host systems 105, and may respond to commands from the host system 105 (e.g., from a host system controller 120). For example, the memory system 110 (e.g., a memory system controller 140) may receive a write command indicating that the memory system 110 is to store data received from the host system 105, or receive a read command indicating that the memory system 110 is to provide data stored in a memory device 145 to the host system 105, or receive a refresh command indicating that the memory system 110 is to refresh data stored in a memory device 145, among other types of commands and operations.

A memory system controller 140 may include at least one of one or more components (e.g., circuitry, logic, instructions) operable to control operations of the memory system 110. A memory system controller 140 may include hardware or instructions that support the memory system 110 performing various operations, and may be operable to receive, transmit, or respond to commands, data, or control information related to operations of the memory system 110. A memory system controller 140 may be operable to communicate with one or more of a host system controller 120, one or more memory devices 145, or a processor 125. In some examples, a memory system controller 140 may control operations of the memory system 110 in cooperation with the host system controller 120, a local controller 150 of a memory device 145, or any combination thereof. Although the example of memory system controller 140 is illustrated as a separate component of the memory system 110, in some examples, aspects of the functionality of the memory system 110 may be implemented by a processor 125, a host system controller 120, at least one of one or more local controllers 150, or any combination thereof.

Each memory device 145 may include a local controller 150 and one or more memory arrays 155. A memory array 155 may be a collection of memory cells (e.g., a two-dimensional array, a three-dimensional array), with each memory cell being operable to store data (e.g., as one or more stored bits). Each memory array 155 may include memory cells of various architectures, such as random access memory (RAM) cells, dynamic RAM (DRAM) cells, synchronous dynamic RAM (SDRAM) cells, static RAM (SRAM) cells, ferroelectric RAM (FeRAM) cells, magnetic RAM (MRAM) cells, resistive RAM (RRAM) cells, phase change memory (PCM) cells, chalcogenide memory cells, not-or (NOR) memory cells, and not-and (NAND) memory cells, or any combination thereof.

A local controller 150 may include at least one of one or more components (e.g., circuitry, logic, instructions) operable to control operations of a memory device 145. In some examples, a local controller 150 may be operable to communicate (e.g., receive or transmit data or commands or both) with a memory system controller 140. In some examples, a memory system 110 may not include a memory system controller 140, and a local controller 150 or a host system controller 120 may perform functions of a memory system controller 140 described herein. In some examples, a local controller 150, or a memory system controller 140, or both may include decoding components operable for accessing addresses of a memory array 155, sense components for sensing states of memory cells of a memory array 155, write components for writing states to memory cells of a memory array 155, or various other components operable for supporting described operations of a memory system 110.

A host system 105 (e.g., a host system controller 120) and a memory system 110 (e.g., a memory system controller 140) may communicate information (e.g., data, commands, control information, configuration information) using one or more channels 115. Each channel 115 may be an example of a transmission medium that carries information, and each channel 115 may include one or more signal paths (e.g., a transmission medium, an electrical conductor, a conductive path) between terminals (e.g., nodes, pins, contacts) associated with the components of the system 100. A terminal may be an example of a conductive input or output point of a device of the system 100, and a terminal may be operable as part of a channel 115. To support communications over channels 115, a host system 105 (e.g., a host system controller 120) and a memory system 110 (e.g., a memory system controller 140) may include receivers (e.g., latches) for receiving signals, transmitters (e.g., drivers) for transmitting signals, decoders for decoding or demodulating received signals, or encoders for encoding or modulating signals to be transmitted, among other components that support signaling over channels 115, which may be included in a respective interface portion of the respective system.

A channel 115 be dedicated to communicating one or more types of information, and channels 115 may include unidirectional channels, bidirectional channels, or both. For example, the channels 115 may include one or more command/address channels, one or more clock signal channels, one or more data channels, among other channels or combinations thereof. In some examples, a channel 115 may be configured to provide power from one system to another (e.g., from the host system 105 to the memory system 110, in accordance with a regulated voltage). In some examples, at least a subset of channels 115 may be configured in accordance with a protocol (e.g., a logical protocol, a communications protocol, an operational protocol, an industry standard), which may support configured operations of and interactions between a host system 105 and a memory system 110.

In some examples, the memory system 110 may support various repair operations, such as a PPR, to correct failures associated with one or more rows or columns of memory arrays 155. For example, the memory system 110 (e.g., a memory system controller 140, a local controller 150) may store an address (e.g., a physical address) of a failed access line by setting one or more OTP elements (e.g., fuses or antifuses) of an array of OTP elements to indicate the address. For example, the memory system 110 may include an OTP array 160-*a* (e.g., of or otherwise accessible via a memory system controller 140), or one or more OTP arrays 160-*b* (e.g., of or otherwise accessible via a local controller 150, accessible via a memory system controller 140), or any combination thereof, which may support storing one or more indications of failed addresses of memory arrays 155 or other components of a memory system 110. Following a repair process, the memory system 110 may reroute commands associated with the stored address to another address (e.g., a different physical address, an address of a same memory array 155 or a different memory array 155) corresponding to a functional access line (e.g., a redundant row, a redundant column).

In some examples, one or more OTP elements of an OTP array 160 may include a transistor that is operable as an antifuse with an initial, non-conductive, physical state assigned to a logic state (e.g., a logic '0'). Each transistor may also include another, conductive, physical state assigned to a different logic state (e.g., a logic '1'), where the transistors may transition from the non-conductive physical state to the conductive physical state using a one-way setting operation. Accordingly, the memory system 110 (or the host system 105) may determine whether or not an OTP element is programmed to the other physical state based on a conductivity of the OTP element. For example, the memory system 110 (e.g., a memory system controller 140, a local controller 150) may selectively apply a voltage or a current to one or more of the OTP elements of an OTP array 160 to set (e.g., program, burn) the OTP elements to the conductive logic state. To illustrate, the memory system 110 may drive a current through a respective gate dielectric between a respective gate and a respective channel of one or more transistors to form a conductive path between the gates and the channels of the transistors, while refraining from forming a conductive path for other transistors. Thus, setting or programming an OTP element may indicate a logic 1 value when read, whereas an OTP element that is not set (e.g., not conductive) may indicate a logic 0 value. This, in some examples, a component of a memory system 110 may be configured to store an address of a failed access line by setting one or more OTP elements of the array of OTP elements to indicate '1's of an address, while skipping over one or more OTP elements to remain in the initial physical state to indicate '0's of the address. Although some implementations of OTP arrays 160 may implement antifuses (e.g., transistors), some implementations of OTP arrays 160 may additionally, or alternatively, implement fuses. Moreover, although some techniques may implement OTP elements (e.g., antifuses, fuses) of an OTP array 160, similar techniques may also be implemented with other types of memory, such as various types of read-only memory (ROM), including erasable programmable ROM (EPROM).

In accordance with examples as disclosed herein, a memory system 110 (e.g., a memory system controller 140, a local controller 150, or a combination thereof) may store an address of a failed access line or an inversion of the address in an OTP array 160 based on a quantity of bits having a logic value (e.g., a logic state, a bit value) being above or below a threshold. For example, the memory system 110 may store an inversion of the address such that logic 1 values are inverted to logic 0 values, and vice versa, by setting OTP elements of an OTP array 160 to indicate the inverted logic 0 values. The memory system 110 may also store an inversion bit (e.g., FBI bit) indicating whether an address is inverted. To read the OTP elements, the memory system 110 (e.g., a memory system controller 140, a local controller 150) may interpret an address when read as inverted or non-inverted based on a value of the inversion bit. In some examples, the memory system 110 (e.g., the memory system controller 140) may indicate one or more steps of the repair to the host system 105 (e.g., to the host system controller 120) to coordinate operations during a repair process.

In addition to applicability in systems as described herein, techniques for bit inversion techniques for memory system repair indications may be generally implemented to improve the performance (e.g., gaming, data processing, artificial intelligence) of various electronic devices and systems. Some electronic device applications, including gaming and other high-performance applications, may be associated with relatively high processing requirements while also benefitting from relatively quick response times to improve user experience. As such, increasing processing speed, decreasing response times, or otherwise improving the performance of electronic devices may be desirable. Implementing the techniques described herein may improve the performance of electronic devices by improving a speed or reliability of memory repair operations (e.g., PPR operations), which may be performed during testing (e.g., validation testing, integration testing, by a manufacturer, by a component integrator), during a system startup (e.g., boot) operation, or during memory operations (e.g., while supporting an application). In some examples, such implementations may reduce latency and response time and improve reliability of one or more evaluation, repair, or computing processes, or otherwise improve user experience, among other benefits.

Figure 2:
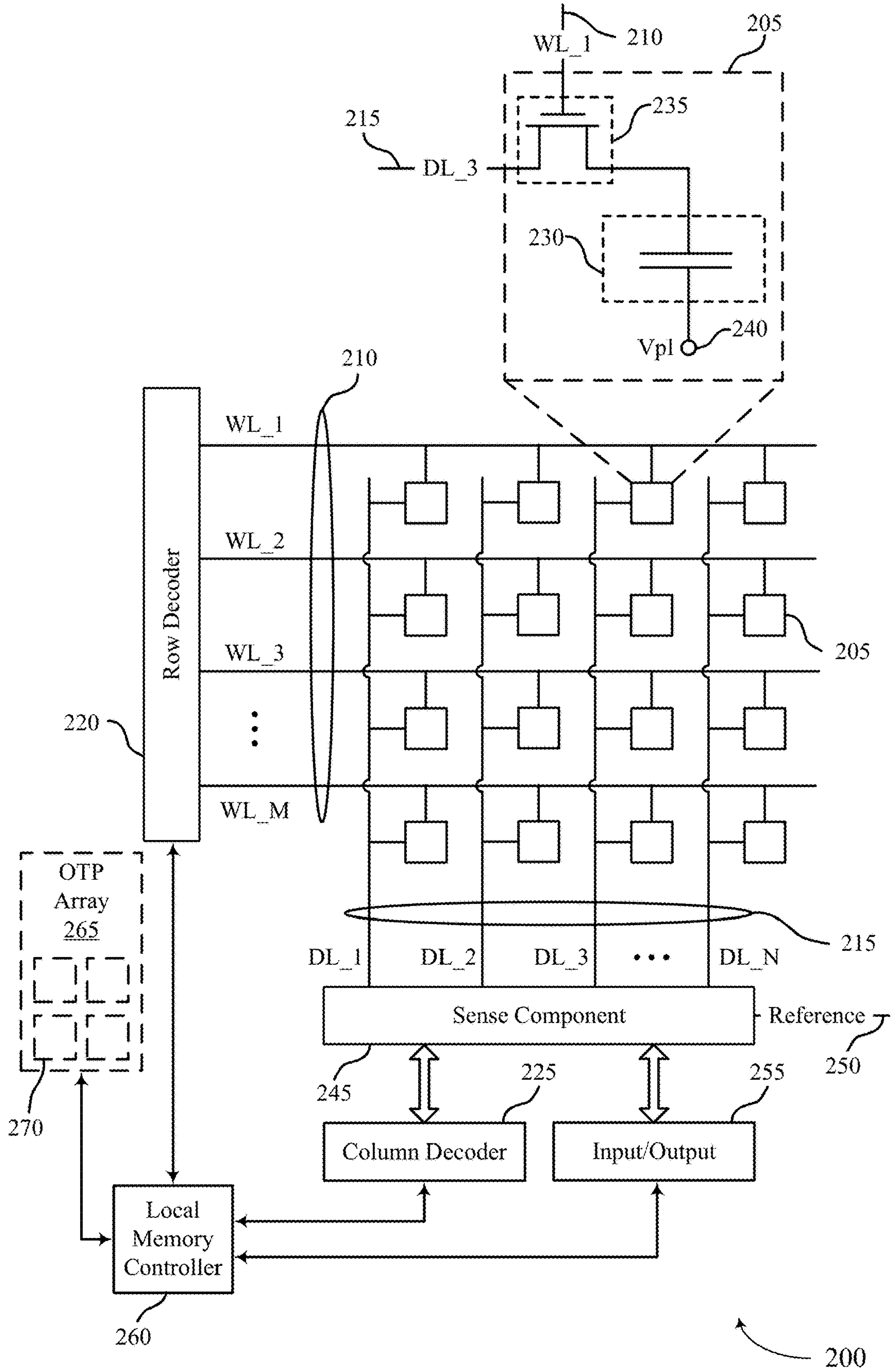
FIG. 2 shows an example of an architecture that supports bit inversion techniques for memory system repair indications in accordance with examples as disclosed herein.

FIG. 2 illustrates an example of an architecture 200 (e.g., a memory architecture) that supports bit inversion techniques for memory system repair indications in accordance with examples as disclosed herein. The architecture 200 may be implemented in a memory system 110 or one or more components thereof (e.g., memory device 145). Aspects of the architecture 200 may be referred to as or implemented in a semiconductor component, such as a memory die.

The architecture 200 includes memory cells 205 that are programmable to store information. In some examples, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). Memory cells 205 may be arranged in an array, such as in a memory array 155.

In the example of architecture 200, a memory cell 205 may include a storage component, such as capacitor 230, and a selection component 235 (e.g., a cell selection component, a transistor). A capacitor 230 may be a dielectric capacitor or a ferroelectric capacitor. A node of the capacitor 230 may be coupled with a voltage source 240, which may be a cell plate reference voltage, such as Vpl, or may be a ground voltage, such as Vss. A charge stored by a memory cell 205 (e.g., by a capacitor 230) may be representative of a programmed state. Other memory architectures that support the techniques described herein may implement different types or arrangements of storage components and associated circuitry (e.g., with or without a selection component).

The architecture 200 may include various arrangements of access lines, such as word lines 210 and digit lines 215. An access line may be a conductive line that is coupled with a memory cell 205, and may be used to perform access operations on the memory cell 205. Word lines 210 may be referred to as row lines, and digit lines 215 may be referred to as column lines or bit lines, among other nomenclature. Memory cells 205 may be positioned at intersections of access lines, and an intersection may be referred to as an address of a memory cell 205.

In some architectures, a word line 210 may be coupled with a gate of a selection component 235 of a memory cell 205, and may be operable to control (e.g., switch, modulate a conductivity of) the selection component 235. A digit line 215 may be operable to couple a memory cell 205 with a sense component 245. In some architectures, a memory cell 205 (e.g., a capacitor 230) may be coupled with a digit line 215 during portions of an access operation. For example, a word line 210 and a selection component 235 of a memory cell 205 may be operable to couple or isolate a capacitor 230 of the memory cell 205 with a digit line 215.

Operations such as reading and writing may be performed on memory cells 205 by activating (e.g., applying a voltage to) access lines such as a word line 210 or a digit line 215. Accessing the memory cells 205 may be controlled through a row decoder 220, or a column decoder 225, or a combination thereof. For example, a row decoder 220 may receive a row address (e.g., from a local memory controller 260) and activate a word line 210 based on a received row address, and a column decoder 225 may receive a column address and activate a digit line 215 based on a received column address. Selecting or deselecting a memory cell 205 may include activating or deactivating a selection component 235 using a word line 210. For example, a capacitor 230 may be isolated from a digit line 215 when the selection component 235 is deactivated, and the capacitor 230 may be coupled with the digit line 215 when the selection component 235 is activated.

A sense component 245 may be operable to detect a state (e.g., a charge) stored by a capacitor 230 of a memory cell 205 and determine a logic state of the memory cell 205 based on the stored state. A sense component 245 may include one or more sense amplifiers to amplify or otherwise convert a signal resulting from accessing the memory cell 205. The sense component 245 may compare a signal detected from the memory cell 205 with a reference 250 (e.g., a reference voltage). The detected logic state of the memory cell 205 may be provided as an output of the sense component 245 (e.g., via an input/output 255), and may indicate the detected logic state to another component of a memory system 110 that implements the architecture 200.

The local memory controller 260 may control the accessing of memory cells 205 through the various components (e.g., a row decoder 220, a column decoder 225, a sense component 245), and may be an example of or otherwise included in a local controller 150, or a memory system controller 140, or both. In some examples, one or more of a row decoder 220, a column decoder 225, and a sense component 245 may be co-located with or included in the local memory controller 260. The local memory controller 260 may be operable to receive commands or data from one or more different controllers (e.g., a host system controller 120, a memory system controller 140), translate the commands or the data into information that can be used by the architecture 200, initiate or control one or more operations of the architecture 200, and communicate data from the architecture 200 to a host (e.g., a host system 105) based on performing the one or more operations.

The local memory controller 260 may be operable to perform one or more access operations on one or more memory cells 205 of the architecture 200. Examples of an access operation may include a write operation, a read operation, a refresh operation, a precharge operation, or an activate operation, among others. In some examples, an access operation may be performed by or otherwise coordinated by the local memory controller 260 in response to one or more access commands (e.g., from a host system 105). The local memory controller 260 may be operable to perform other access operations not listed here or other operations related to the operating of the architecture 200 that are not directly related to accessing the memory cells 205.

To support an access operation, a local memory controller 260 may identify a target memory cell 205 on which to perform the access operation, which may be associated with identifying a target word line 210 and a target digit line 215 coupled with the target memory cell 205 (e.g., an address of the target memory cell 205). The local memory controller 260 may control activating the target word line 210 and the target digit line 215 to access the target memory cell 205. During a write operation, the local memory controller 260 may control the application of a signal (e.g., a write pulse, a write voltage) to the target digit line 215 to store a specific state (e.g., a charge, in a capacitor 230) of the memory cell 205. The signal used as part of the write operation may include one or more voltage levels applied to the target memory cell 205 (e.g., via the target digit line 215) over one or more respective durations. During a read operation, the target memory cell 205 may transfer a signal (e.g., charge, voltage) to the sense component 245 based on activating the target word line 210 and the target digit line. The local memory controller 260 may activate the sense component 245 (e.g., initiate latching a sense amplifier of the sense component 245), which may include comparing the signal transferred from the memory cell 205 to a reference (e.g., the reference 250). Based on the comparison, the sense component 245 may determine a logic state that is stored on the memory cell 205.

In some examples, the architecture 200 (e.g., a local memory controller 260) may support various repair operations, including PPR to correct failures associated with one or more word lines 210 (e.g., rows) or digit lines 215 (e.g., columns). For example, the local memory controller 260 may store an address of a failed word line 210 or of a failed digit line 215 by setting one or more OTP elements (e.g., fuses or antifuses) of an array of OTP elements to indicate the address. For example, the architecture 200 may optionally include an OTP array 265 of multiple OTP elements 270, where the OTP array 265 may be coupled with (e.g., accessible by) the local memory controller 260. In some examples, the OTP array 265 may be an example of an OTP array 160. Following a repair process, the architecture 200 (e.g., the local memory controller 260) may reroute access operations associated with the stored address to another address corresponding to a functional access line (e.g., a different word line 210, a different digit line 215).

In accordance with examples as disclosed herein, the architecture 200 (e.g., using the local memory controller 260) may store an address of a failed access line (e.g., word line 210 or digit line 215) or an inversion of the address in an OTP array 265 based on a quantity of bits having a logic value above a threshold. For example, the architecture 200 may store an inversion of the address such that logic 1 values are inverted to logic 0 values, and vice versa, by setting OTP elements 270 to indicate the inverted logic 0 values. The architecture 200 may also store an inversion bit (e.g., FBI bit stored in an OTP element 270) to indicate whether an address is inverted. To read the OTP elements 270, the architecture 200 may interpret an address when read as inverted or non-inverted based on a value of the inversion bit. In some examples, the architecture 200 (e.g., via the local memory controller 260) may support indicating one or more steps of the repair to a host system 105 (e.g., to a host system controller 120) to coordinate operations during a repair process.

Figure 3:
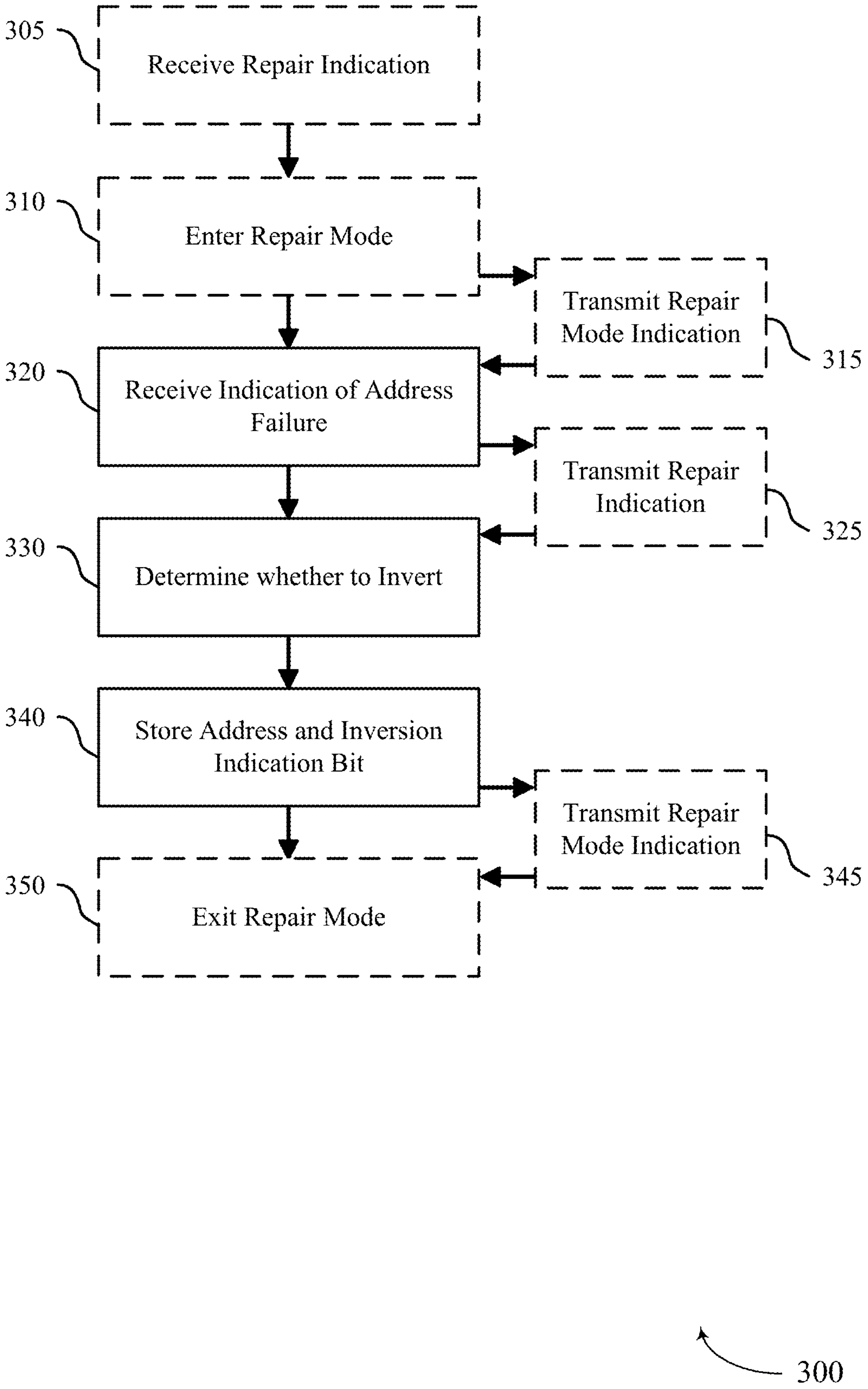
FIG. 3 shows an example of a process that supports bit inversion techniques for memory system repair indications in accordance with examples as disclosed herein.

FIG. 3 shows a block diagram of a process 300 (e.g., a repair process, a PPR operation) that supports bit inversion techniques for memory system repair indications in accordance with examples as disclosed herein. The process 300 illustrates operations that may be performed by one or more components of a system 100. For example, the process 300 may illustrate a set of steps of a PPR operation performed by a memory system 110 (e.g., a memory system controller 140, a memory device 145, a local controller 150, or a combination thereof) in communication with a host system 105. In some examples, aspects of the process 300 may reduce a quantity of OTP elements that are set to indicate an address of a failed access line (e.g., a failed word line 210, a failed digit line 215).

At 305, in some examples, the memory system 110 (e.g., a memory system controller 140, a local controller 150) may receive a repair indication (e.g., an indication to enter a repair mode, an indication to perform a PPR, a command, a request, permission from a host system 105 or a memory system controller 140). In some examples, the indication may include an indication of one or more guard keys, which may be used to prevent the memory system 110 or component thereof from entering a repair mode while performing other operations, such as operations commanded by the host system 105.

At 310, in some examples, the memory system 110 (e.g., a memory system controller 140, a local controller 150) may enter a repair mode (e.g., in response to an indication of 305, based on a determination at the memory system 110 with or without an indication of 305). In some examples, the repair mode may be associated with a hard PPR (hPPR) operation, which may involve a persistent (e.g., permanent) repair that includes setting one or more OTP storage elements (e.g., of an OTP array 160, of an OTP array 265).

At 320, the memory system 110 may receive an indication of a failure associated with an address of a memory array 155 of the memory system 110 (e.g., associated with a word line 210, associated with a digit line 215). In some examples, prior to receiving the indication of 320, the memory system 110 may have transmitted repair data including a failed address to a host system 105 and, at 320, may receive a signal including the address. Additionally, or alternatively, memory system 110 may receive a signal indicating a failure of the address (e.g., without the address included in the signal), and the address may have been determined and maintained at the memory system 110. In some examples, a failed address may be determined by a host system 105 and indicated to the memory system 110 in the indication of 320. In some examples, the indication of 320 may be received as part of an activation (ACT) command. In some cases, the memory system 110 may refrain from transmitting an address to the host system 105 and may perform an automatic self-repair procedure. For example, at 320, a controller of the memory system 110 may receive an indication of the failure from an error detection function of the memory system 110.

At 330 (e.g., to support storing an indication of the address), the memory system 110 may determine whether to invert a set of bits of the address. For example, the memory system 110 may determine if a quantity of bits of the address corresponding to a logic state (e.g., a logic 1) satisfies a threshold (e.g., is greater than half of the bits, is greater than or equal to half of the bits) to determine whether to store an inversion of the address and to determine an FBI bit indicating the inversion. For example, the FBI bit may have a logic 0 value to indicate that the address is non-inverted, or a logic 1 value to indicate that the address is inverted.

The memory system 110 may implement various techniques to determine whether a quantity of bits of the address corresponding to a logic state satisfies a threshold. For example, the memory system 110 may determine whether a sum of the bits of the address having a logic 1 value satisfies a threshold. In some cases, the memory system 110 may add all bits of the address having a logic 1 in one clock cycle in a counter and may compare the sum to half of the total quantity of address bits to determine if more than half of the bits have a logic 1 value. Additionally, or alternatively, the memory system 110 may add the bits by shifting a bit of each OTP element into an adder for each clock cycle. In some cases, the memory system 110 may perform analog weighting of the bits to generate a voltage based on the address bits. For example, the memory system 110 may compare an analog sum of voltages (e.g., each generated by respective bits having logic 1 values) to a threshold voltage to determine whether or not half of the bits have a logic 1 value.

In some examples, the memory system 110 may consider an FBI bit in the determination of 330. For example, a logic value 1 may be added in a sum of the string of bits to consider time involved with setting the FBI bit in the determination. Additionally, or alternatively, a threshold may be greater so that inversion is performed when more than half of bits have a logic 1, which may be implemented to accommodate extra time involved with setting an FBI bit to indicate inversion. In some examples, a threshold quantity of bits, or a threshold voltage for an analog sum, may be based on a value to accommodate initialization or concluding operations to set the OTP elements, such as operations that involve a voltage pull-up or a return to a base voltage.

At 340, the memory system 110 may store the indication of the address or an inversion of the address using OTP elements of an OTP array based on the determination of 330. For example, if a quantity of logic 1 values of the address is greater than the threshold, the memory system 110 may store an inversion of the address, so logic 1 values may be written as logic 0 values, and vice versa, by setting OTP elements to indicate the inverted logic 0 values. The memory system 110 may also store the FBI bit as a logic 1 value. Additionally, or alternatively, if the memory system 110 determines that the quantity of bits having a logic 1 value of the address are less than or equal to the threshold, the memory system 110 may store the logic 1 values by setting OTP elements and may skip over other OTP elements to indicate a logic 0 value, and may store a logic 0 value as the FBI bit (e.g., maintaining the state of the OTP element). Additionally, or alternatively, an FBI bit may be stored inversely as a '0' to indicate inversion and a '1' to indicate a non-inverted address is stored. In some examples, to invert the address for storing, the memory system 110 may calculate the FBI bit and may perform an XOR operation of the address with the FBI bit, where the result of the XOR operation may be the original address or an inversion of the address based on the value of the FBI bit, and may be stored accordingly.

In some examples, the memory system 110 may set the OTP elements sequentially. For example, the memory system 110 may apply the voltage for a set amount of time to set one or more transistors to be conductive while skipping over other transistors. In some examples, inverting the address or not inverting the address based on the determination of 330 may support a relatively lower quantity of OTP setting operations. For example, by inverting the address when more than half of the bits indicate to set an OTP element to '1', relatively fewer OTP elements may be set regardless of an address bit string. This may reduce power consumption, as well as increase a speed of operations or a reliability of the OTP element programming. For example, if a same duration for programming each OTP element is used, a total write speed for indicating the failed address (e.g., a fusing time, tPGM) and the PPR operation may be increased by reducing a total "burn time" or other duration to set the OTP elements (e.g., by skipping a majority of the OTP elements). Additionally, or alternatively, for a fixed total programming time for PPR operations, a longer duration may be allocated for setting each OTP element (e.g., to apply a programming voltage, to apply a programming current) to increase a reliability that the OTP elements are successfully set.

At 350, in some examples, the memory system 110 may exit the repair mode. For example, once a final bit for indicating the failed address is set (e.g., including the FBI bit, where applicable), the memory system 110 may exit the repair mode. Additionally, or alternatively, the memory system 110 may exit the repair mode following a configured duration for performing the process 300. In some cases, the memory system 110 may be triggered by the host system 105 to exit the repair mode once the address has been stored at 340. For example, the host system 105 may be an example of a GPU that monitors for signaling from the memory system 110. After the host system 105 receives a feedback signal indicating that the repair (e.g., hPPR) is done, the host system 105 may trigger the memory system 110 to exit the repair mode, for example, by transmitting a signal (e.g., a command signal). Additionally, or alternatively, the host system 105 may trigger exit of the repair mode once an amount of time has elapsed since a start of the repair mode. In some cases, the memory system 110 may exit the repair mode following the set of the last bit and OTP element, and may indicate to the host system 105 that the memory system 110 has exited the repair process without transmitting an indication that the repair procedure is completed. In some examples, the host system 105 may leverage the FBI benefits to the system application (e.g., of the steps 305-350) by adjusting a time for setting OTPs (e.g., program time (tPGM) or "fusing" time) to speed up the OTP setting or to increase the reliability as described herein.

In some examples, the memory system 110 may communicate with the host system 105 (e.g., with the host system controller 120 of the host system 105) to support one or more aspects of the described techniques. For example, at 315, the memory system 110 may optionally transmit (e.g., from memory system 110 to the host system 105) a repair mode indication (e.g., a "Ready for Repair" indication, a "Repair Mode Entered" indication) indicating that the memory system 110 has entered a repair mode (e.g., a PPR mode) or is ready to perform a repair (e.g., based on receiving an indication to enter a repair mode at 305). In some examples, the memory system 110 may receive the indication of the failure associated with the address based on (e.g., in response to) transmitting the indication at 315. Additionally, or alternatively, at 325, the memory system 110 may optionally transmit a repair indication (e.g., a "Repair in Progress" indication) indicating that the memory system 110 is performing a repair process (e.g., based on receiving the indication of the failure associated with the address). At 345, the memory system 110 may optionally transmit a repair mode indication (e.g., a "Repair Done" indication, a "Repair Mode Exited" indication) associated with a completion of the repair process.

In some examples, the memory system 110 may replace a failed access line (e.g., row, column) associated with the stored address with a different access line based on storing the indication of the address and the inversion indication bit at 340. For example, after performing the process 300, the memory system 110 may read the set of OTP elements to determine the address corresponding to a failed access line, and may reroute access operations intended for the failed address to a redundant access line. In some examples, a stored address from the process 300 may be distributed to one or more components of the memory system 110, the host system 105, or both, following a reboot procedure to enable each component to divert commands for the failed address to a redundant access line.

In some examples, the memory system 110 may determine that the address is inverted when reading the stored address. For example, based on the FBI bit indicating inversion (e.g., FBI bit set to '1'), the memory system 110 may invert the stored address after reading it, or may refrain from inverting the address if the FBI bit is set to '0'. Additionally, or alternatively, the memory system 110 may first read the FBI bit, and depending on the FBI bit, may interpret the OTP elements differently. For example, if the FBI bit is set to a logic 1 value, the memory system 110 may read set OTP elements as having logic 0 values, and unchanged OTP elements as having logic 1 values. In some examples, to invert the address when reading, the memory system 110 may perform an XOR operation of the read address with the FBI bit, where the result of the XOR operation may be the original address or an inversion of the address based on the logic value of the FBI bit.

Figure 4A:
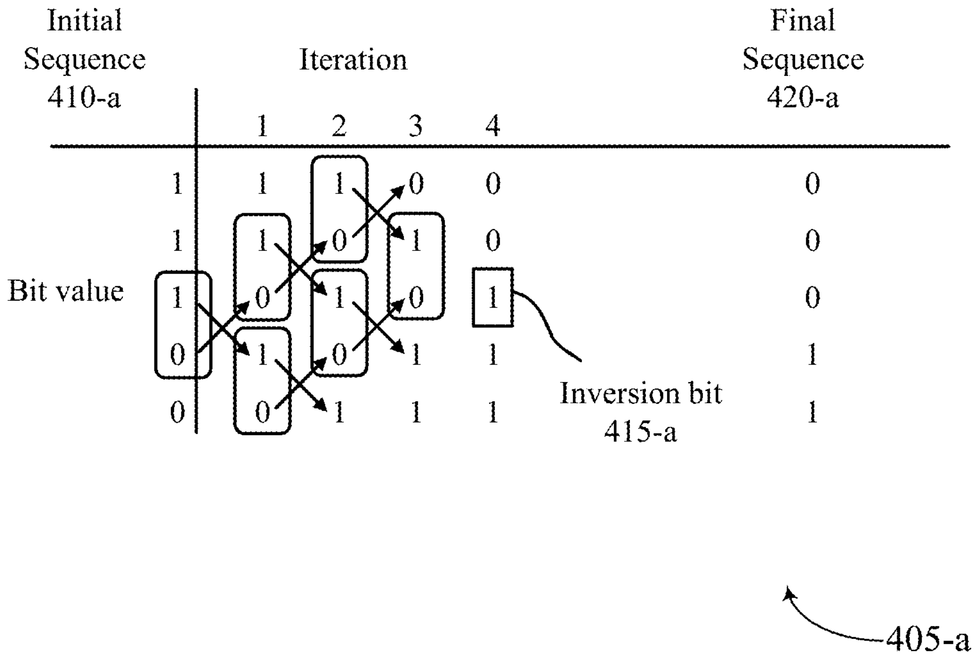
FIGS. 4A and 4B show examples of ordering operations that support bit inversion techniques for memory system repair indications in accordance with examples as disclosed herein.
Figure 4B:
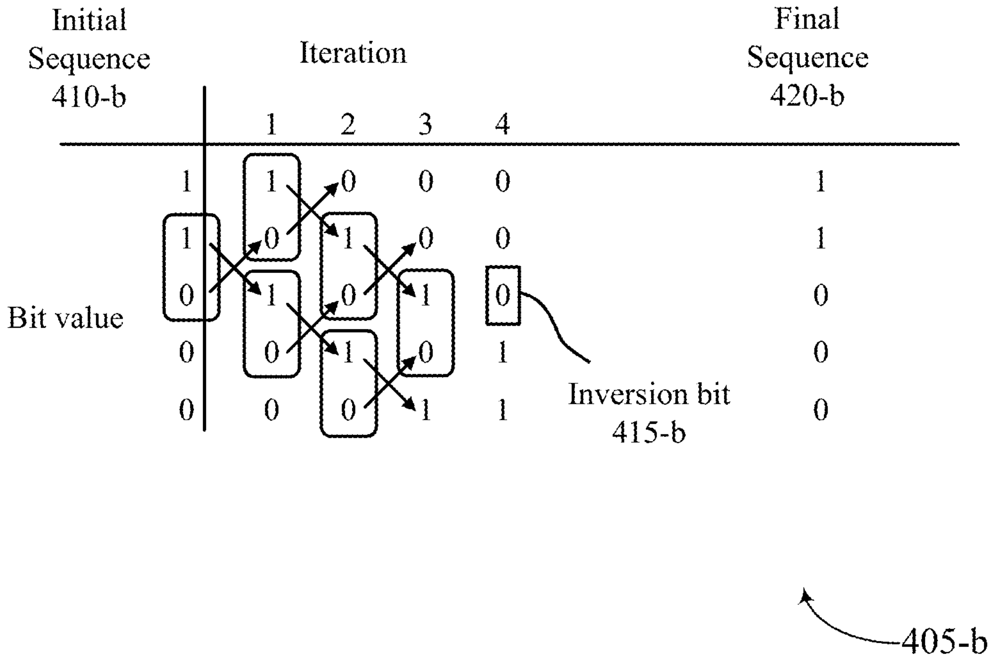

FIGS. 4A and 4B shows examples of ordering operations 405-*a* and 405-*b* that support bit inversion techniques for memory system repair indications in accordance with examples as disclosed herein. The ordering operations 405-*a* and 405-*b* may illustrate operations of one or more components of a system 100 or an architecture 200 (e.g., of a memory die) or of a process 300 as described with reference to FIGS. 1-3. For example, the ordering operations 405-*a* and 405-*b* may illustrate examples of implementing (e.g., at a local controller 150, at a memory system controller 140) an ordering operation of bits of a failed address of a memory array (e.g., a memory array 155) to determine whether or not to invert the address when storing in an array of OTP elements. For example, the memory system 110 may order (e.g., rearrange) the bits of an address by moving logic 1 values toward one side and logic 0 values toward another side of a bit string as described herein. In some examples, the ordering operations 405-*a* and 405-*b* may be performed by gate logic or other circuitry of a controller, such as a local controller 150 or a memory system controller 140.

In the example of ordering operation 405-*a*, an initial sequence 410-*a* corresponding to an address of an access line may include a total of N=5 bits with the values "11100." However, the described techniques may be implemented for an initial sequence having other values or other quantities of bits. The memory system 110 may proceed to order the bits during one or more iterations. For example, the memory system 110 may perform ordering during N−1=4 iterations for determining an inversion bit as described herein. In some examples, the memory system 110 may order the bits by exchanging adjacent bits with a bit value of "10" with the bit value of "01", while all other three bit combinations stay as they are. For example, during a first iteration (e.g., during a first clock cycle), the memory system 110 may determine that the first three bits are the same '1' value, but that a '1' bit is different from a next '0' bit, and may exchange the position of the two bits due to the '1' bit being before the '0' bit, resulting in the bit string "11010". The memory system 110 may similarly continue this process by swapping '1's and '0's in iterations 2, 3, and 4 to give the bit strings "10101", then "01011", and finally "00111." In some examples, by swapping the bits so '1's are on one side and '0's are on another side, the initial sequence 410-*a* may be ordered so bit values of '1' are together and bit values of '0' are together regardless of the original bit sequence. Additionally, or alternatively, an initial sequence 410 may be ordered so that a portion of the bit values of '1' and '0' are ordered together. For example, at large values of N, after N−1 iterations, not all '1's and '0's may be grouped together (e.g., some may still be mixed).

After ordering the bits, the memory system 110 may determine an inversion bit 415-*a* (e.g., which may represent an FBI bit for storing the address) based on a middle (e.g., center) bit after the last iteration. For example, a middle bit of the last iteration (e.g., of the N−1 iterations) may have a bit value of 1, which may be used as the FBI bit for storing the address. In some cases, the middle bit may be used as the FBI bit after N−1 iterations regardless of whether all or part of the bits of the initial sequence 410-*a* are ordered together. In some examples, based on the bit value being a 1, the memory system 110 may determine that the initial sequence 410-*a* has more 1 bit values than 0 bit values, and may determine to store an inversion of the initial sequence 410-*a*. For example, the memory system 110 may invert the bits of the initial sequence 410-*a* to generate a final sequence 420-*a* of "00011" to be written to OTP elements, which may be an inversion of the original bits of the address. The memory system 110 may store the final sequence 420-*a* (e.g., corresponding to an inversion of the address) and the inversion bit 415-*a* within an array of OTP elements. In some examples, storing the inversion of the address corresponding to the final sequence 420-*a* may reduce a program time of the OTP elements or increase a reliability of the OTP programming as described herein by reducing a quantity of OTP elements to be programmed. For example, to store the final sequence 420-*a*, the memory system may set two OTP elements to store the two 1 bit values, which may involve a shorter duration than storing the three 1 bit values of the initial sequence 410-*a*.

By way of another example, the memory system 110 may order bits of an initial sequence 410-*b*, which may include initial bit values of "11000." The memory system 110 may similarly order the bits over N−1=4 iterations, which may result in an ordered bit string of "00011." The memory system 110 may determine that the initial sequence 410-*b* has more 0 values than 1 values based on the middle bit, or inversion bit 415-*b*, having a value of 0. Thus, the memory system 110 may determine a final sequence 420-*b* to be non-inverted (e.g., unchanged) and to have a same bit string as the initial sequence 410-*b*, and may store the final sequence 420-*b* and the inversion bit 415-*b* in the array of OTP elements accordingly to set fewer of the OTP elements.

In some examples, the memory system 110 may determine an inversion bit 415 based on whether or not an initial sequence 410 has an even or odd quantity of bits. For example, in an odd quantity of bits, the memory system 110 may select a central or middle bit as shown in FIGS. 4A and 4B. However, for an even quantity of bits, the memory system 110 may select an inversion bit 415 based on a middle two bit values having a same or different value. For example, if a final iteration results in a central two bits of 11, the memory system 110 may select an inversion bit 415 as 1, or if the central two bits are 00, the memory system 110 may select the inversion bit 415 as 0. If the central two bits have different values, such as "01" or "10," the memory system 110 may default to storing an unchanged address, or an inverted address.

In some examples, the memory system 110 may determine an inversion bit 415 based on adding a placeholder bit to an initial sequence 410 before ordering bits. For example, if a placeholder bit value of 0 is included at the beginning of an initial sequence 410 with an odd quantity of bits, a resulting string for ordering may have an even quantity of bits, and thus a new value for the inversion bit 415 may be determined based on a last middle bit of two middle bits of the final ordered sequence. Similarly, adding an inversion bit to the ordering of an even quantity of bits may result in an odd quantity bit string to order, and so a middle bit and a next subsequent bit may be used to determine two bits for determining a value of the inversion bit 415.

Figure 5:
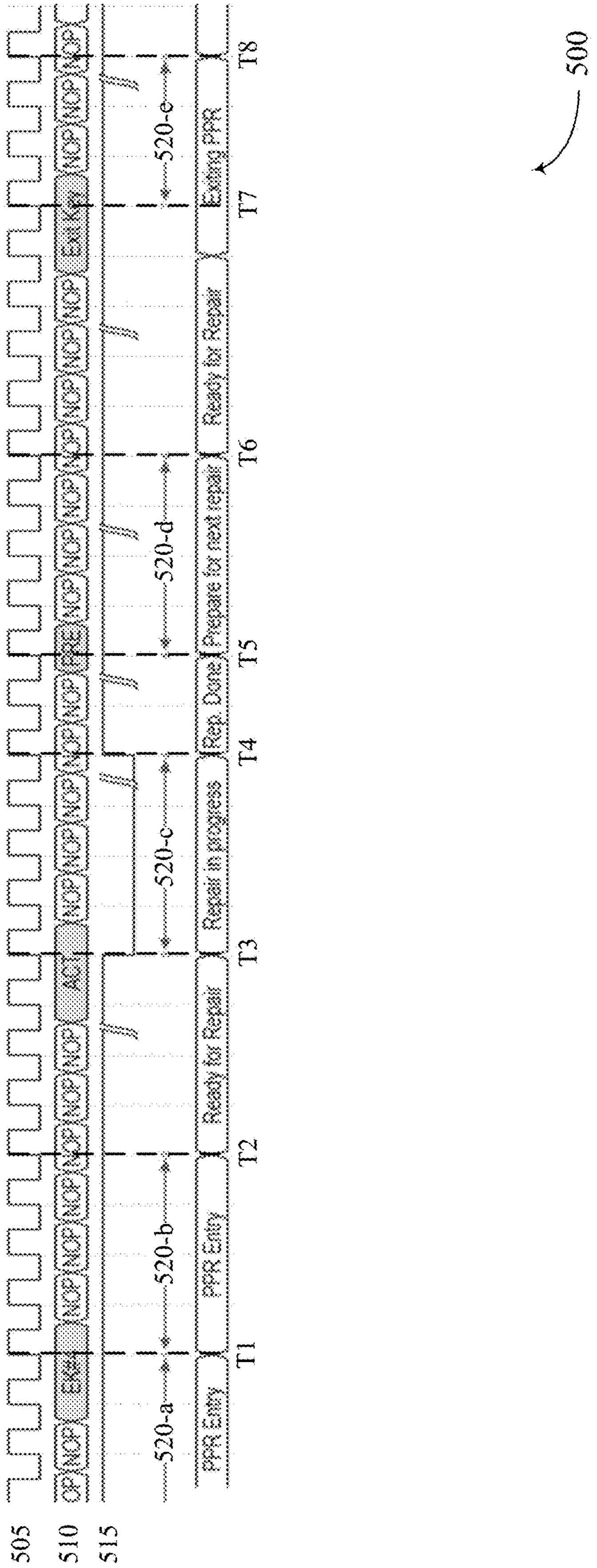
FIG. 5 shows an example of a signaling diagram that supports bit inversion techniques for memory system repair indications in accordance with examples as disclosed herein.

FIG. 5 shows an example of a signaling diagram 500 that supports bit inversion techniques for memory system repair indications in accordance with examples as disclosed herein. The signaling diagram 500 may illustrate signaling between one or more components of a system 100 (e.g., performing a process 300). For example, the signaling diagram 500 may illustrate examples of signaling between components (e.g., a local controller 150, a memory system controller 140) of a memory system 110 and components (e.g., a host system controller 120) of a host system 105. In some examples, during one or more operations, the memory system 110 and the host system 105 may exchange, in relation to a clock signaling 505, command signaling 510 including data, one or more commands, or both, and feedback signaling 515. In some examples, the feedback signaling 515 may include an hPPR feedback with toggle, and may alternate between a high (e.g., "ON") voltage and a low (e.g., "OFF" or not transmitting) voltage. In some other examples, the feedback signaling 515 may include more than two levels, such as signaling that is modulated in accordance with three levels (e.g., a three-level phase-amplitude modulation, such as a PAM3 modulation), with four levels (e.g., a four-level phase-amplitude modulation, such as a PAM4 modulation), or other multi-level modulation scheme.

The feedback signaling 515 may represent one or more signals transmitted during a repair process (e.g., a process 300). For example, the memory system 110 may receive one or more entry keys for an entry mode via the command signaling 510. In an example, the memory system 110 may receive an EK #4 signal (e.g., a last four keys of a PPR entry sequence) via the command signaling 510, which may indicate one or more guard keys and may indicate to enter a PPR mode (e.g., to initiate the process 300). Additionally, or alternatively, the memory system 110 may receive any quantity of entry keys or different signal levels via the command signaling 510 for PPR mode entry or for entry into another mode. In some examples, the entry key signal may be sent, and the memory system 110 (e.g., via a receiver) may, at a time T1, latch the entry key signal between portions of a PPR entry period with durations 520-*a* and 520-*b*. The memory system 110 may subsequently enter a PPR mode.

At T3, the memory system 110 may latch a received command indicating a failure of one or more addresses (e.g., included in command or other accompanying indication, stored at memory system 110). For example, the memory system 110 may latch an ACT command or other command or indication indicating a failure of one or more addresses for performing the PPR operation (e.g., an example of an indication of 320 of the process 300). Based on the ACT command, the memory system 110 may begin the PPR operation, and may transmit an indication of the memory system 110 performing the PPR operation (e.g., an example of an indication of 325 of the process 300). For example, the memory system 110 may set the feedback signaling 515 to a low level to indicate that a repair is in progress. In some examples, the memory system 110 may perform the repair between times T3 and T4 during a duration 520-*c*, which may include one or more of the operations of 330 and 340 of the process 300. The duration 520-*c* may be defined by tPGM, and in some cases, the memory system 110 may program more than one address during tPGM. Additionally, or alternatively, the memory system 110 may latch another type of command indicating the failure of the one or more addresses. For example, the memory system 110 may latch a mode register set (MRS) command or other command indicating the failure and the one or more addresses included in the command or stored at the memory system 110.

In some examples, following tPGM after T4, the memory system 110 may transmit an indication that the PPR operation is complete (e.g., an example of the indication of 345 of process 300). For example, the memory system 110 may set the feedback signaling 515 to high. In some examples, the signaling may indicate that the memory system 110 has exited the repair mode. Additionally, or alternatively, the signaling may indicate that the memory system 110 has finished a PPR operation (e.g., storing one or more failed addresses), where the host system 105 may trigger exit of the PPR mode. For example, during a duration 520-*d* between T5 and T6, the memory system 110 may prepare for a next repair operation. In some examples, the host system 105 may indicate to perform another PPR operation (e.g., where a command is latched by the memory system 110 at a time following T6). Additionally, or alternatively, based on the indication that the PPR operation is complete, the host system 105 may transmit a command to exit the PPR mode, such as an exit key, in the command signaling 510. The memory system 110 may exit the PPR mode using the exit key during a duration 520-*e* between times T7 and T8.

Transmitting the feedback signaling 515 may allow the memory system 110 and the host system 105 to improve a PPR sequence as described herein. For example, by signaling when the PPR operation is complete (e.g., as the repair may be performed in a relatively shorter duration due to blowing fewer of the OTP elements), the host system 105 (e.g., a GPU) may continue to a next operation which may save time and increase a speed of the GPU processes while reducing latency due to PPR operations. Additionally, or alternatively, the host system 105 may configure the memory system 110 with a same tPGM that may be long enough to perform longer or shorter PPR operations, which may allow the memory system 110 to have additional time when programming individual OTP elements (e.g., when prioritizing reliability of the OTP element programming). Feedback signaling 515 may also allow the host system 105 to confirm proper execution of the PPR operation.

Figure 6:
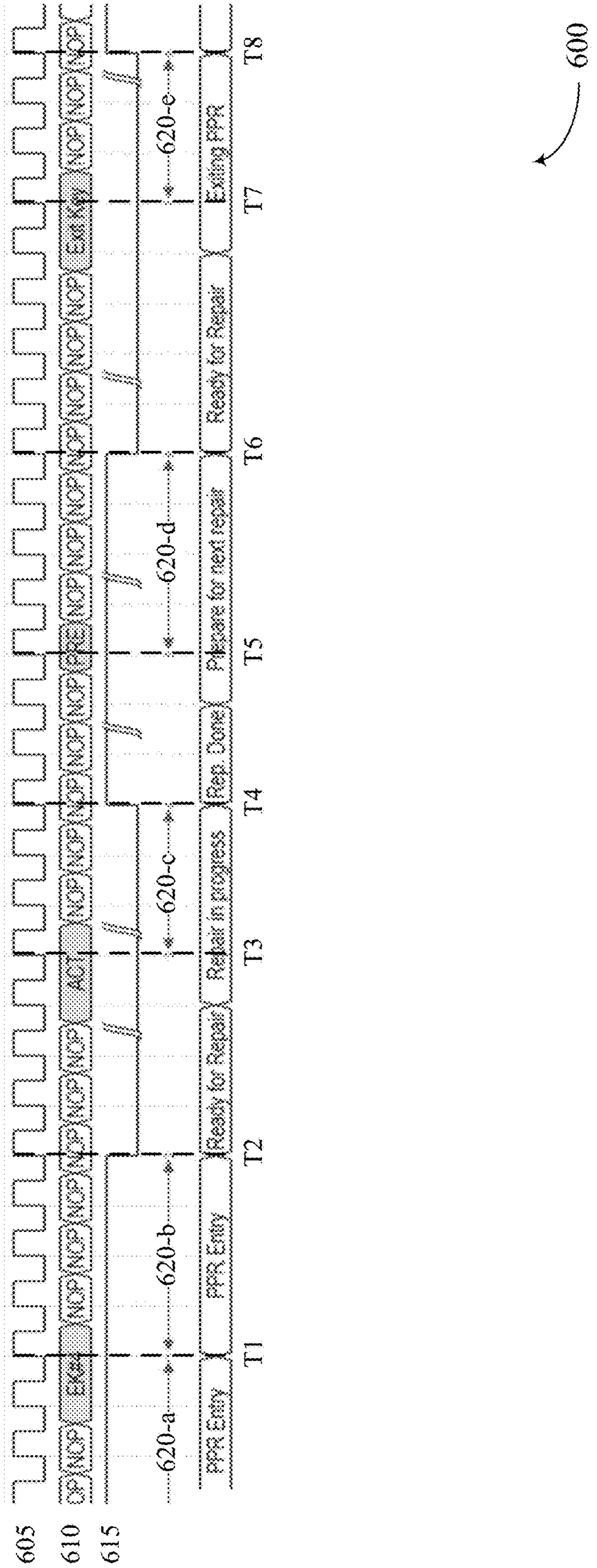
FIG. 6 shows an example of a signaling diagram that supports bit inversion techniques for memory system repair indications in accordance with examples as disclosed herein.

FIG. 6 shows an example of a signaling diagram 600 that supports bit inversion techniques for memory system repair indications in accordance with examples as disclosed herein. The signaling diagram 600 may illustrate signaling between one or more components of a system 100 (e.g., performing a process 300). For example, the signaling diagram 600 may illustrate examples of signaling between components (e.g., a local controller 150, a memory system controller 140) of a memory system 110 and components (e.g., a host system controller 120) of a host system 105. In some examples, during one or more operations, the memory system 110 and the host system 105 may exchange, in relation to a clock signaling 605, command signaling 610 including data, one or more commands, or both, and feedback signaling 615. For example, the signaling diagram 600 may illustrate feedback signaling 615 to indicate both repair progress indications and correct hPPR acknowledgment indications.

The memory system 110 may receive an indication (e.g., an EK #4 indication, one or more entry keys, an entry command) in the command signaling 610 and may latch the indication at a time T1 between durations 620-*a* and 620-*b* for PPR entry, the command signaling 610 (e.g., via the EK #4 indication) indicating to enter a PPR mode. The memory system 110 may transmit an indication that the memory system 110 has entered a PPR mode (e.g., an example of the indication of 315 of process 300), where the host system 105 may latch the indication at a time T2. For example, the memory system 110 may set the feedback signaling 615 to low (e.g., OFF, or not transmitting) to acknowledge correct hPPR entry. In some examples, based on setting the feedback signaling 615 to low, the host system 105 may transmit an ACT command indicating a failure of one or more addresses to the memory system 110 (which may latch the ACT command at T3), where the memory system 110 may perform a PPR operation during the duration 620-*c* until T4. The memory system may also transmit signaling indicating an exit or completion of the PPR operation (which may be latched by the host system 105 at T4).

In some examples, the memory system 110 may set the feedback signaling 615 to low again at T6 following a duration 620-*d* to indicate that the memory system 110 is ready to perform another PPR operation (e.g., if the memory system 110 remained in PPR mode following T4). For example, the host system 105 may transmit another command (e.g., an ACT command, an MRS command, or other command indicating one or more failed addresses) for the memory system 110 to perform another PPR operation. Additionally, or alternatively, at T7, the memory system 110 may latch an exit command indicating an exit key, where the memory system 110 may exit the PPR mode using the exit key during a duration 620-*e* before a time T8. In some examples, combining the hPPR mode entry acknowledgment and the repair progress notifications in the feedback signaling 615 using an extended protocol as shown may allow the host system 105 to confirm both proper entry in hPPR mode and proper execution of a PPR process (e.g., signaling at a time when repair is ended) using one level toggling of a single signal, which may save power and improve efficiency of communications. Additionally, or alternatively, the feedback signaling 615 may allow the host system 105 and the memory system 110 to reduce a time of PPR operations (e.g., by blowing fewer than a threshold quantity of fuses) or increase a reliability of repair operations (e.g., by increasing programming time to reliably set OTP elements).

Figure 7:
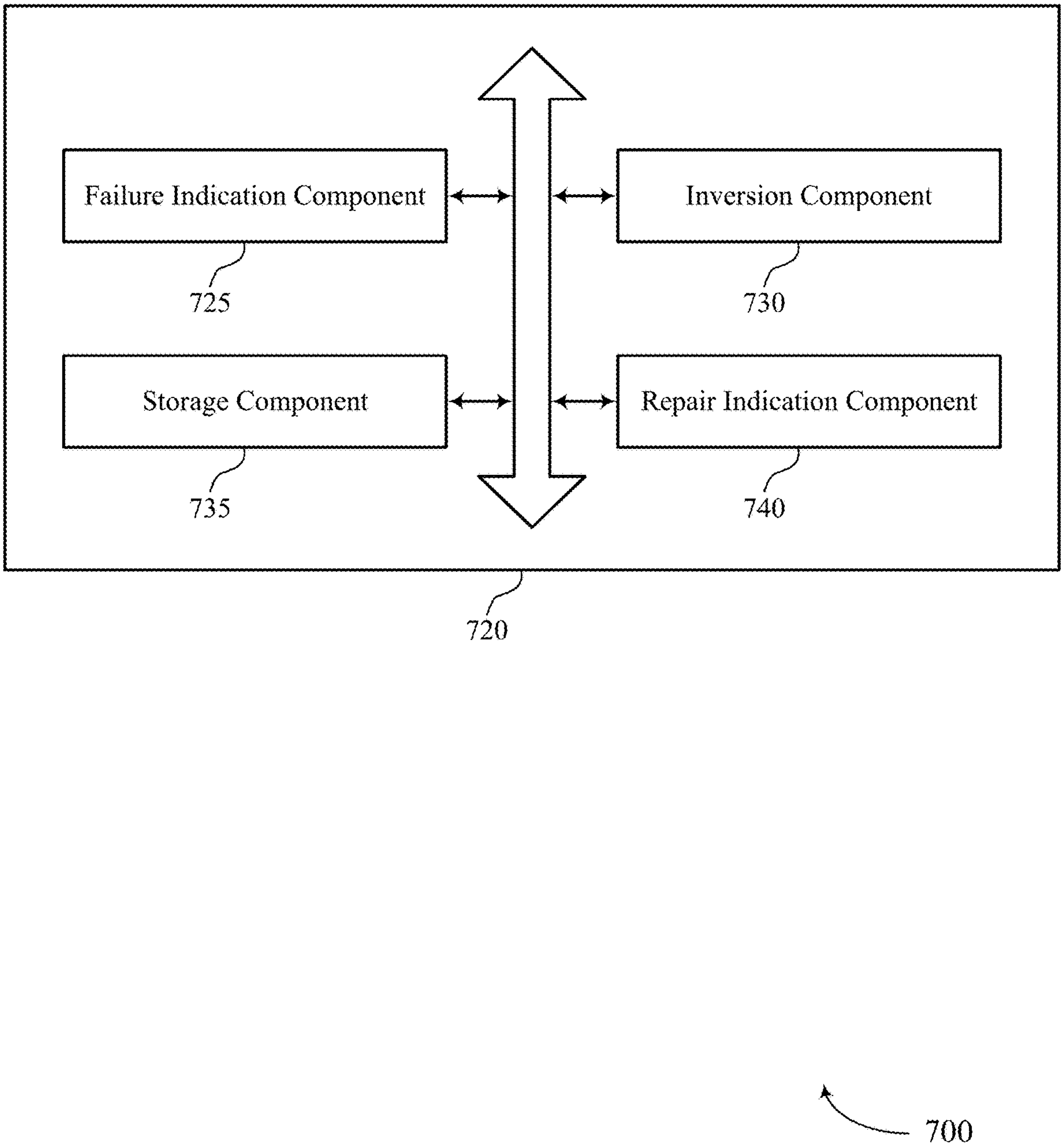
FIG. 7 shows a block diagram of a memory system that supports bit inversion techniques for memory system repair indications in accordance with examples as disclosed herein.

FIG. 7 shows a block diagram 700 of a memory system 720 that supports bit inversion techniques for memory system repair indications in accordance with examples as disclosed herein. The memory system 720 may be an example of aspects of a memory system as described with reference to FIGS. 1 through 6. The memory system 720, or various components thereof, may be an example of means for performing various aspects of bit inversion techniques for memory system repair indications as described herein. For example, the memory system 720 may include a failure indication component 725, an inversion component 730, a storage component 735, a repair indication component 740, or any combination thereof. Each of these components, or components of subcomponents thereof (e.g., one or more processors, one or more memories), may communicate, directly or indirectly, with one another (e.g., via one or more buses).

The failure indication component 725 may be configured as or otherwise support a means for receiving, at the memory system 720, a first indication of a failure associated with an address of a memory array of the memory system 720. The inversion component 730 may be configured as or otherwise support a means for determining, at the memory system 720, whether to store a second indication of the address using a plurality of address bits associated with the address or an inversion of the plurality of address bits based at least in part on a quantity of the plurality of address bits that have a bit value. The storage component 735 may be configured as or otherwise support a means for storing the second indication of the address using a plurality of OTP memory elements of an array of OTP memory elements of the memory system 720 based at least in part on the determining. In some examples, the storage component 735 may be configured as or otherwise support a means for storing an inversion indication bit using an OTP memory element of the array of OTP memory elements, the inversion indication bit indicating whether the plurality of OTP memory elements store the plurality of address bits or the inversion of the plurality of address bits.

In some examples, to support storing the second indication of the address, storing the inversion indication bit, or both, the storage component 735 may be configured as or otherwise support a means for forming, through one or more transistors of a plurality of transistors, a respective conductive path between a respective gate and a respective channel of the one or more transistors based at least in part on driving a current through a respective gate dielectric between the respective gate and the respective channel.

In some examples, to support storing the second indication of the address, storing the inversion indication bit, or both, the storage component 735 may be configured as or otherwise support a means for refraining from forming, through one or more second transistors of the plurality of transistors, a respective conductive path between a respective gate and a respective channel of the one or more second transistors.

In some examples, the repair indication component 740 may be configured as or otherwise support a means for transmitting, from the memory system 720, a third indication of the memory system 720 performing a repair operation based at least in part on receiving the first indication of the failure associated with the address.

In some examples, the failure indication component 725 may be configured as or otherwise support a means for receiving, at the memory system 720, a third indication to enter a repair mode. In some examples, the repair indication component 740 may be configured as or otherwise support a means for transmitting, from the memory system 720, a fourth indication that the memory system 720 has entered the repair mode based at least in part on receiving the third indication, and receiving the first indication of the failure associated with the address may be based at least in part on transmitting the fourth indication.

In some examples, the repair indication component 740 may be configured as or otherwise support a means for transmitting, from the memory system, a third indication that the memory system 720 has exited a repair mode based at least in part on storing the second indication of the address and storing the inversion indication bit.

In some examples, to support determining whether to store the second indication of the address using the plurality of address bits or the inversion of the plurality of address bits, the inversion component 730 may be configured as or otherwise support a means for determining whether a sum of the inversion indication bit and the quantity of the plurality of address bits having the bit value satisfies a threshold.

In some examples, to support determining whether to store the second indication of the address using the plurality of address bits or the inversion of the plurality of address bits, the inversion component 730 may be configured as or otherwise support a means for ordering one or more first bits of the plurality of address bits and having the bit value into a first group of a string of bits. In some examples, to support determining whether to store the second indication of the address using the plurality of address bits or the inversion of the plurality of address bits, the inversion component 730 may be configured as or otherwise support a means for ordering one or more second bits of the plurality of address bits and having a second bit value different from the bit value into a second group of the string of bits following the first group. In some examples, to support determining whether to store the second indication of the address using the plurality of address bits or the inversion of the plurality of address bits, the inversion component 730 may be configured as or otherwise support a means for determining whether a bit at a position of the string of bits has the bit value or the second bit value based at least in part on ordering the one or more first bits into the first group and the one or more second bits into the second group.

In some examples, the described functionality of the memory system 720, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory system 720, or various components thereof, may be implemented at least in part by instructions (e.g., stored in memory, non-transitory computer-readable medium) executable by such at least one processor.

Figure 8:
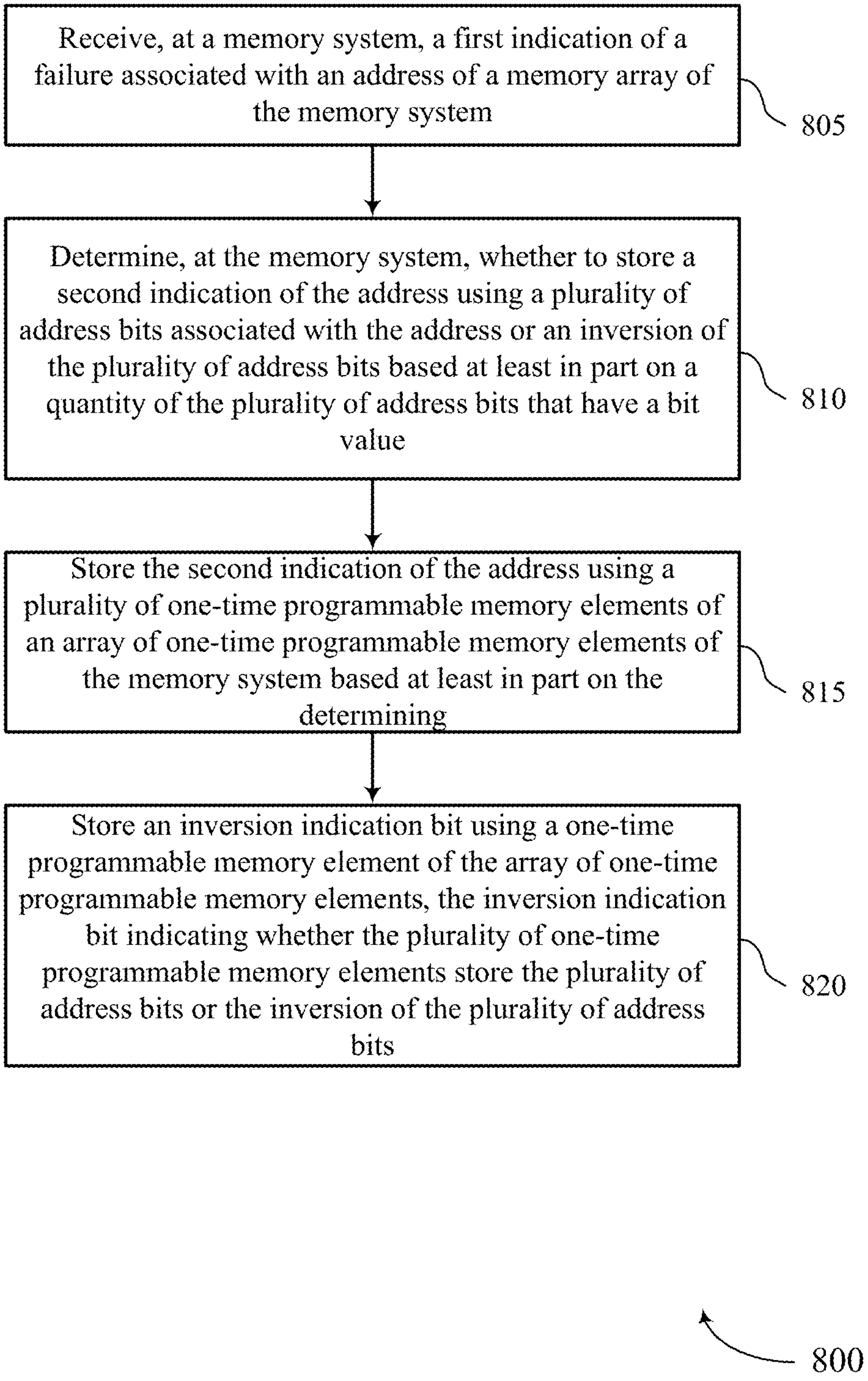
FIG. 8 shows a flowchart illustrating a method or methods that support bit inversion techniques for memory system repair indications in accordance with examples as disclosed herein.

FIG. 8 shows a flowchart illustrating a method 800 that supports bit inversion techniques for memory system repair indications in accordance with examples as disclosed herein. The operations of method 800 may be implemented by a memory system or its components as described herein. For example, the operations of method 800 may be performed by a memory system as described with reference to FIGS. 1 through 7. In some examples, a memory system may execute a set of instructions to control the functional elements of the device to perform the described functions. Additionally, or alternatively, the memory system may perform aspects of the described functions using special-purpose hardware.

At 805, the method may include receiving, at a memory system, a first indication of a failure associated with an address of a memory array of the memory system. In some examples, aspects of the operations of 805 may be performed by a failure indication component 725 as described with reference to FIG. 7.

At 810, the method may include determining, at the memory system, whether to store a second indication of the address using a plurality of address bits associated with the address or an inversion of the plurality of address bits based at least in part on a quantity of the plurality of address bits that have a bit value. In some examples, aspects of the operations of 810 may be performed by an inversion component 730 as described with reference to FIG. 7.

At 815, the method may include storing the second indication of the address using a plurality of OTP memory elements of an array of OTP memory elements of the memory system based at least in part on the determining. In some examples, aspects of the operations of 815 may be performed by a storage component 735 as described with reference to FIG. 7.

At 820, the method may include storing an inversion indication bit using an OTP memory element of the array of OTP memory elements, the inversion indication bit indicating whether the plurality of OTP memory elements store the plurality of address bits or the inversion of the plurality of address bits. In some examples, aspects of the operations of 820 may be performed by a storage component 735 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory system, a first indication of a failure associated with an address of a memory array of the memory system; determining, at the memory system, whether to store a second indication of the address using a plurality of address bits associated with the address or an inversion of the plurality of address bits based at least in part on a quantity of the plurality of address bits that have a bit value; storing the second indication of the address using a plurality of one-time programmable memory elements of an array of one-time programmable memory elements of the memory system based at least in part on the determining; and storing an inversion indication bit using a one-time programmable memory element of the array of one-time programmable memory elements, the inversion indication bit indicating whether the plurality of one-time programmable memory elements store the plurality of address bits or the inversion of the plurality of address bits.

Aspect 2: The method, apparatus, or non-transitory computer-readable medium of aspect 1, where storing the second indication of the address, storing the inversion indication bit, or both includes operations, features, circuitry, logic, means, or instructions, or any combination thereof for forming, through one or more transistors of a plurality of transistors, a respective conductive path between a respective gate and a respective channel of the one or more transistors based at least in part on driving a current through a respective gate dielectric between the respective gate and the respective channel.

Aspect 3: The method, apparatus, or non-transitory computer-readable medium of aspect 2, where storing the second indication of the address, storing the inversion indication bit, or both includes operations, features, circuitry, logic, means, or instructions, or any combination thereof for refraining from forming, through one or more second transistors of the plurality of transistors, a respective conductive path between a respective gate and a respective channel of the one or more second transistors.

Aspect 4: The method, apparatus, or non-transitory computer-readable medium of any of aspects 1 through 3, further including operations, features, circuitry, logic, means, or instructions, or any combination thereof for transmitting, from the memory system, a third indication of the memory system performing a repair operation based at least in part on receiving the first indication of the failure associated with the address.

Aspect 5: The method, apparatus, or non-transitory computer-readable medium of any of aspects 1 through 4, further including operations, features, circuitry, logic, means, or instructions, or any combination thereof for receiving, at the memory system, a third indication to enter a repair mode and transmitting, from the memory system, a fourth indication that the memory system has entered the repair mode based at least in part on receiving the third indication, where receiving the first indication of the failure associated with the address is based at least in part on transmitting the fourth indication.

Aspect 6: The method, apparatus, or non-transitory computer-readable medium of any of aspects 1 through 5, further including operations, features, circuitry, logic, means, or instructions, or any combination thereof for transmitting, from the memory system, a third indication that the memory system has exited a repair mode based at least in part on storing the second indication of the address and storing the inversion indication bit.

Aspect 7: The method, apparatus, or non-transitory computer-readable medium of any of aspects 1 through 6, where determining whether to store the second indication of the address using the plurality of address bits or the inversion of the plurality of address bits includes operations, features, circuitry, logic, means, or instructions, or any combination thereof for determining whether a sum of the inversion indication bit and the quantity of the plurality of address bits having the bit value satisfies a threshold.

Aspect 8: The method, apparatus, or non-transitory computer-readable medium of any of aspects 1 through 7, where determining whether to store the second indication of the address using the plurality of address bits or the inversion of the plurality of address bits includes operations, features, circuitry, logic, means, or instructions, or any combination thereof for ordering one or more first bits of the plurality of address bits and having the bit value into a first group of a string of bits; ordering one or more second bits of the plurality of address bits and having a second bit value different from the bit value into a second group of the string of bits following the first group; and determining whether a bit at a position of the string of bits has the bit value or the second bit value based at least in part on ordering the one or more first bits into the first group and the one or more second bits into the second group.

It should be noted that the aspects described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 9: An apparatus (e.g., a memory system, a memory device), including: a memory array including a plurality of memory cells and a plurality of access lines coupled with the plurality of memory cells; an array of one-time programmable memory elements; and circuitry coupled with the memory array and the array of one-time programmable memory elements and operable to: receive a first indication of a failure associated with an address of the memory array; determine whether to store a second indication of the address using a plurality of address bits associated with the address or an inversion of the plurality of address bits based at least in part on a quantity of the plurality of address bits that have a bit value; store the second indication of the address using a plurality of one-time programmable memory elements of the array of one-time programmable memory elements based at least in part on the determining; and store an inversion indication bit using a one-time programmable memory element of the array of one-time programmable memory elements, the inversion indication bit indicating whether the plurality of one-time programmable memory elements store the plurality of address bits or the inversion of the plurality of address bits.

Aspect 10: The apparatus of aspect 9, where the array of one-time programmable memory elements includes a plurality of transistors and, to store the second indication of the address, or to store the inversion indication bit, or both, the circuitry is operable to: form, through one or more transistors of the plurality of transistors, a respective conductive path between a respective gate and a respective channel of the one or more transistors based at least in part on driving a current through a respective gate dielectric between the respective gate and the respective channel.

Aspect 11: The apparatus of aspect 10, where, to store the second indication of the address, or to store the inversion indication bit, or both, the circuitry is operable to: refrain from forming, through one or more second transistors of the plurality of transistors, a respective conductive path between a respective gate and a respective channel of the one or more second transistors.

Aspect 12: The apparatus of any of aspects 9 through 11, where the circuitry is further operable to: transmit (e.g., from the apparatus) a third indication of the apparatus performing a repair operation based at least in part on receiving the first indication of the failure associated with the address.

Aspect 13: The apparatus of any of aspects 9 through 12, where the circuitry is further operable to: receive (e.g., at the apparatus) a third indication to enter a repair mode; and transmit (e.g., from the apparatus) a fourth indication that the apparatus has entered the repair mode based at least in part on receiving the third indication, where receiving the first indication of the failure associated with the address is based at least in part on transmitting the fourth indication.

Aspect 14: The apparatus of any of aspects 9 through 13, where the circuitry is further operable to: transmit (e.g., from the apparatus) a third indication that the apparatus has exited a repair mode based at least in part on storing the second indication of the address and storing the inversion indication bit.

Aspect 15: The apparatus of any of aspects 9 through 14, where, to determine whether to store the second indication of the address using the plurality of address bits or the inversion of the plurality of address bits, the circuitry is operable to: determine whether a sum of the inversion indication bit and the quantity of the plurality of address bits having the bit value satisfies a threshold.

Aspect 16: The apparatus of any of aspects 9 through 15, where, to determine whether to store the second indication of the address using the plurality of address bits or the inversion of the plurality of address bits, the circuitry is operable to: order one or more first bits of the plurality of address bits and having the bit value into a first group of a string of bits; order one or more second bits of the plurality of address bits and having a second bit value different from the bit value into a second group of the string of bits following the first group; and determine whether a bit at a position of the string of bits has the bit value or the second bit value based at least in part on ordering the one or more first bits into the first group and the one or more second bits into the second group.

Aspect 17: The apparatus of any of aspects 9 through 16, where the circuitry is operable to: generate a voltage based at least in part on the quantity of the plurality of address bits that have the bit value; and determine whether to store the second indication of the address using the plurality of address bits or the inversion of the plurality of address bits based at least in part on a comparison of the generated voltage with a threshold.

Aspect 18: The apparatus of any of aspects 9 through 17, where the circuitry is further operable to: perform a repair operation to replace a failed row of memory cells of the plurality of memory cells associated with the address with a second row of memory cells of the plurality of memory cells based at least in part on storing the second indication of the address and storing the inversion indication bit.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms “electronic communication,” “conductive contact,” “connected,” and “coupled” may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. A conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or may be an indirect conductive path that includes intermediate components, such as switches, transistors, or other components. In some examples, the flow of signals between the connected components may be interrupted for a time, for example, using one or more intermediate components such as switches or transistors.

A switching component (e.g., a transistor) discussed herein may be a field-effect transistor (FET), and may include a source (e.g., a source terminal), a drain (e.g., a drain terminal), a channel between the source and drain, and a gate (e.g., a gate terminal). A conductivity of the channel may be controlled (e.g., modulated) by applying a voltage to the gate which, in some examples, may result in the channel becoming conductive. A switching component may be an example of an n-type FET or a p-type FET.

The description set forth herein, in connection with the appended drawings, describes example configurations and does not represent all the examples that may be implemented or that are within the scope of the claims. The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Similar components may be distinguished by following the reference label by one or more dashes and additional labeling that distinguishes among the similar components. If just the first reference label is used in the specification, the description is applicable to any one of the similar components having the same first reference label irrespective of the additional reference labels.

The functions described herein may be implemented in hardware, software executed by a processing system (e.g., one or more processors, one or more controllers, control circuitry processing circuitry, logic circuitry), firmware, or any combination thereof. If implemented in software executed by a processing system, the functions may be stored on or transmitted over as one or more instructions (e.g., code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processor. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium, or combination of multiple media, that can be accessed by a computer. By way of example, and not limitation, non-transitory computer-readable media can comprise RAM, ROM, electrically erasable programmable read-only memory (EEPROM), optical disk storage, magnetic disk storage or other magnetic storage devices, or any other non-transitory medium or combination of media that can be used to carry or store desired program code means in the form of instructions or data structures and that can be accessed by a computer, or a processor.

The descriptions and drawings are provided to enable a person having ordinary skill in the art to make or use the disclosure. Various modifications to the disclosure will be apparent to the person having ordinary skill in the art, and the techniques disclosed herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:

a memory array comprising a plurality of memory cells and a plurality of access lines coupled with the plurality of memory cells;

an array of one-time programmable memory elements; and circuitry coupled with the memory array and the array of one-time programmable memory elements and operable to:

receive a first indication of a failure associated with an address of the memory array;

determine whether to store a second indication of the address using a plurality of address bits associated with the address or using an inversion of the plurality of address bits based at least in part on a quantity of the plurality of address bits that have a bit value;

store the second indication of the address using a plurality of one-time programmable memory elements of the array of one-time programmable memory elements based at least in part on the determination; and store an inversion indication bit using a one-time programmable memory element of the array of one-time programmable memory elements, the inversion indication bit indicating whether the plurality of one-time programmable memory elements store the plurality of address bits or the inversion of the plurality of address bits.

2. The apparatus of claim 1, wherein the array of one-time programmable memory elements comprises a plurality of transistors and, to store the second indication of the address, or to store the inversion indication bit, or both, the circuitry is operable to:

form, through one or more transistors of the plurality of transistors, a respective conductive path between a respective gate and a respective channel of the one or more transistors based at least in part on driving a current through a respective gate dielectric between the respective gate and the respective channel.

3. The apparatus of claim 2, wherein, to store the second indication of the address, or to store the inversion indication bit, or both, the circuitry is operable to:

refrain from forming, through one or more second transistors of the plurality of transistors, a respective conductive path between a respective gate and a respective channel of the one or more second transistors.

4. The apparatus of claim 1, wherein the circuitry is further operable to:

transmit a third indication of the apparatus performing a repair operation based at least in part on receiving the first indication of the failure associated with the address.

5. The apparatus of claim 1, wherein the circuitry is further operable to:

receive a third indication to enter a repair mode; and transmit a fourth indication that the apparatus has entered the repair mode based at least in part on receiving the third indication, wherein receiving the first indication of the failure associated with the address is based at least in part on transmitting the fourth indication.

6. The apparatus of claim 1, wherein the circuitry is further operable to:

transmit a third indication that the apparatus has exited a repair mode based at least in part on storing the second indication of the address and storing the inversion indication bit.

7. The apparatus of claim 1, wherein, to determine whether to store the second indication of the address using the plurality of address bits or the inversion of the plurality of address bits, the circuitry is operable to:

determine whether a sum of the inversion indication bit and the quantity of the plurality of address bits having the bit value satisfies a threshold.

8. The apparatus of claim 1, wherein, to determine whether to store the second indication of the address using the plurality of address bits or the inversion of the plurality of address bits, the circuitry is operable to:

order one or more first bits of the plurality of address bits and having the bit value into a first group of a string of bits;

order one or more second bits of the plurality of address bits and having a second bit value different from the bit value into a second group of the string of bits following the first group; and determine whether a bit at a position of the string of bits has the bit value or the second bit value based at least in part on ordering the one or more first bits into the first group and the one or more second bits into the second group.

9. The apparatus of claim 1, wherein the circuitry is operable to:

generate a voltage based at least in part on the quantity of the plurality of address bits that have the bit value; and determine whether to store the second indication of the address using the plurality of address bits or the inversion of the plurality of address bits based at least in part on a comparison of the voltage with a threshold.

10. The apparatus of claim 1, wherein the circuitry is further operable to:

perform a repair operation to replace a failed row of memory cells of the plurality of memory cells associated with the address with a second row of memory cells of the plurality of memory cells based at least in part on storing the second indication of the address and storing the inversion indication bit.

11. A method, comprising:

receiving, at a memory system, a first indication of a failure associated with an address of a memory array of the memory system;

determining, at the memory system, whether to store a second indication of the address using a plurality of address bits associated with the address or using an inversion of the plurality of address bits based at least in part on a quantity of the plurality of address bits that have a bit value;

storing the second indication of the address using a plurality of one-time programmable memory elements of an array of one-time programmable memory elements of the memory system based at least in part on the determining; and storing an inversion indication bit using a one-time programmable memory element of the array of one-time programmable memory elements, the inversion indication bit indicating whether the plurality of one-time programmable memory elements store the plurality of address bits or the inversion of the plurality of address bits.

12. The method of claim 11, wherein storing the second indication of the address, storing the inversion indication bit, or both, comprises:

forming, through one or more transistors of a plurality of transistors, a respective conductive path between a respective gate and a respective channel of the one or more transistors based at least in part on driving a current through a respective gate dielectric between the respective gate and the respective channel.

13. The method of claim 12, wherein storing the second indication of the address, storing the inversion indication bit, or both, comprises:

refraining from forming, through one or more second transistors of the plurality of transistors, a respective conductive path between a respective gate and a respective channel of the one or more second transistors.

14. The method of claim 11, further comprising:

transmitting, from the memory system, a third indication of the memory system performing a repair operation based at least in part on receiving the first indication of the failure associated with the address.

15. The method of claim 11, further comprising:

receiving, at the memory system, a third indication to enter a repair mode; and transmitting, from the memory system, a fourth indication that the memory system has entered the repair mode based at least in part on receiving the third indication, wherein receiving the first indication of the failure associated with the address is based at least in part on transmitting the fourth indication.

16. The method of claim 11, further comprising:

transmitting, from the memory system, a third indication that the memory system has exited a repair mode based at least in part on storing the second indication of the address and storing the inversion indication bit.

17. The method of claim 11, wherein determining whether to store the second indication of the address using the plurality of address bits or the inversion of the plurality of address bits comprises:

determining whether a sum of the inversion indication bit and the quantity of the plurality of address bits having the bit value satisfies a threshold.

18. The method of claim 11, wherein determining whether to store the second indication of the address using the plurality of address bits or the inversion of the plurality of address bits comprises:

ordering one or more first bits of the plurality of address bits and having the bit value into a first group of a string of bits;

ordering one or more second bits of the plurality of address bits and having a second bit value different from the bit value into a second group of the string of bits following the first group; and determining whether a bit at a position of the string of bits has the bit value or the second bit value based at least in part on ordering the one or more first bits into the first group and the one or more second bits into the second group.

19. A non-transitory computer-readable medium storing code, the code comprising instructions executable by a processing system to:

receive, at a memory system, a first indication of a failure associated with an address of a memory array of the memory system;

determine, at the memory system, whether to store a second indication of the address using a plurality of address bits associated with the address or using an inversion of the plurality of address bits based at least in part on a quantity of the plurality of address bits that have a bit value;

store the second indication of the address using a plurality of one-time programmable memory elements of an array of one-time programmable memory elements of the memory system based at least in part on the determination; and store an inversion indication bit using a one-time programmable memory element of the array of one-time programmable memory elements, the inversion indication bit indicating whether the plurality of one-time programmable memory elements store the plurality of address bits or the inversion of the plurality of address bits.

20. The non-transitory computer-readable medium of claim 19, wherein the instructions to store the inversion indication bit, or both, are executable by the processing system to:

form, through one or more transistors of a plurality of transistors, a respective conductive path between a respective gate and a respective channel of the one or more transistors based at least in part on driving a current through a respective gate dielectric between the respective gate and the respective channel.

* * * * *